United States Patent [19]

Goto et al.

[11] 4,112,305

[45] Sep. 5, 1978

[54] METHOD OF PROJECTING A BEAM OF CHARGED PARTICLES

[75] Inventors: Eiichi Goto, Fujisawa; Takashi Soma, Kiyose; Masanori Idesawa, Wako, all of Japan

[73] Assignee: Rikagaku Kenkyusho, Japan

[21] Appl. No.: 732,919

[22] Filed: Oct. 15, 1976

[30] Foreign Application Priority Data

Oct. 23, 1975 [JP] Japan .............................. 50-127833

[51] Int. Cl.² .............................................. A61K 27/02
[52] U.S. Cl. .................................. 250/492 R; 250/398
[58] Field of Search ....................... 250/492 A, 492 R; 250/398

[56] References Cited

U.S. PATENT DOCUMENTS

| 3,644,700 | 2/1972 | Kruppa et al. | 250/492 A |
| 3,922,546 | 11/1975 | Livesay | 250/492 A |
| 3,936,693 | 2/1976 | Parks et al. | 313/429 |

*Primary Examiner*—Harold A. Dixon
*Attorney, Agent, or Firm*—Bucknam and Archer

[57] ABSTRACT

Disclosed is a method of projecting on selected areas of a target a variety of charged particles each having a different shape of cross-section. The charged particle projecting method according to this invention is suitable for production of micro-circuits.

A microcircuit is formed on a wafer in the form of patchwork by repeatedly exposing a selected area of the wafer to each of a variety of charged particle beams, thus shortening the time involved for production compared with the time which would be taken if a similar microcircuit is produced by blotting selected areas of the wafer with beam spot.

9 Claims, 10 Drawing Figures

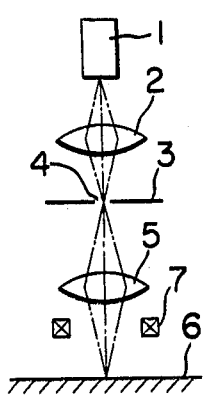
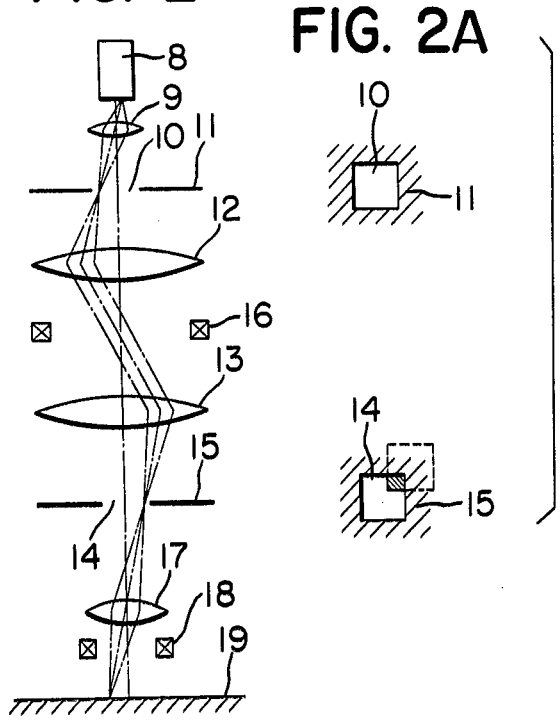
FIG. 1 FIG. 2 FIG. 2A
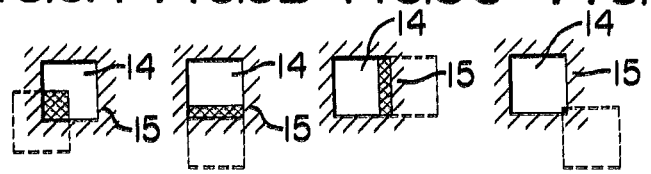
FIG.3A FIG.3B FIG.3C FIG.3D
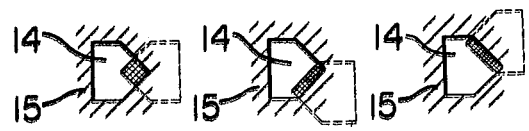
FIG.4A FIG.4B FIG.4C

METHOD OF PROJECTING A BEAM OF CHARGED PARTICLES

This invention relates generally to an improvement in or relating to a sweeping method using a beam of charged particles, and particularly to a method of projecting a beam of charged particles which method is useful in producing microcircuits. There has been an increasing demand for precision and compact integration of microcircuits, and hitherto the electron beam projecting art has been used to meet such demand.

FIG. 1 shows the conventional system for projecting an electron beam. In FIG. 1 an electron beam from an electron beam source 1 passes through a first converging lens 2 to focus at the aperture 4 of an apertured mask 3. The so-converged electron beam diverges after passing through the mask 3, and finally converges on a target 6 after passing through a second converging (or projecting) lens 5. The image of the mask aperture which is reduced in size and projected on the target, is moved so as to sweep the target under the influence of a deflecting means 7 (deflecting coils or deflecting plates), thus drawing a desired pattern of circuit on the target. The beam spot which is used in drawing a desired pattern on the target is very small, and is usually about 0.1 microns in diameter.

Assuming that a $0.1\mu$ beam spot is used to blot a $1\mu \times 10\mu$ square area in a target, the target must be exposed to the mean spot one thousand times. As is apparent, blotting and forming a desired pattern on the target according to the conventional method requires an elongated length of time.

One object of this invention is to provide an improved method of projecting a beam of charged particles. Another object is to provide a method of controlling the shape of cross-section of the beam, and at the same time the projecting position of the beam spot on the target.

Still another object is to provide a method of projecting a beam of charged particles, if applied to microelectronics, requiring much less time in forming a desired circuit pattern on a substrate.

To attain these objects a charged particle beam projecting method according to this invention uses two masks each having an aperture of a relatively simple shape such as a square or polygon. According to this invention such apertured masks are put in the path of charged beam, and the beam after passing through the aperture of one of the masks, is deflected with regard to the other mask so that the other mask allows only a selected part of the beam to pass and fall on a selected area of the target.

The term, "charged particles" herein used should be understood to be electrons and ions.

This invention will be better understood from the following description of a preferred embodiment which is shown in the accompanying drawings.

FIG. 2 is a charged particle projecting system to which the method according to this invention is applied.

FIG. 2A illustrates the relationship of the beam to the apertures of FIG. 2.

FIGS. 3A, 3B, 3C and 3D show different deflected relationships of a square beam and square aperture.

FIGS. 4A, 4B and 4C show different deflected relationships of a pentagon beam to a pentagon aperture.

FIG. 3A is a schematic diagram showing deflection of the beam in relation to the second mask to produce one cross-section shape of the beam incident on the target.

FIG. 3B is a schematic diagram similar to FIG. 3A but showing a different deflection of the beam to produce another cross-section shape thereof at the target incidence.

FIG. 3C is a schematic diagram similar to FIG. 3A but showing a further beam deflection producing a still different beam cross-section at target incidence.

FIG. 3D is a schematic diagram similar to FIG. 3A showing an extreme beam deflection to produce a minimal size, generally square beam cross-section at target incidence.

FIG. 4A is a schematic diagram showing the beam cross-section at target incidence produced by a certain beam deflection when using pentagonal aperture masks.

FIG. 4B is a schematic diagram similar to FIG. 4A showing under similar conditions the beam cross-section at target incidence resulting from another deflection of the beam.

FIG. 4C is a schematic diagram similar to FIG. 4A showing the beam cross-section for a beam deflection of about the same magnitude as in FIG. 4B but opposite in direction.

Hereinafter, this invention is described as using an electron beam, but this should not be understood to be limitative.

Referring to FIG. 2, there is shown a preferred embodiment according to this invention. An electron beam from an electron beam source 8 passes a first converging lens 9 to focuss on a first mask 11 having an aperture of simple shape 10 as for instance square. After passing through the square aperture of the first mask, the square beam passes two converging lenses 12 and 13 to focuss on a second mask 15 having an aperture of similar square shape 14. The square beam is deflected with regard to the aperture 14 of the second mask 15 by a deflecting means 16 so that the second mask allows only a selected part of the beam to pass therethrough (see cross-hatched portions in FIG. 3). The shape of the selected part of electron beam depends on the degree and direction of such deflection. Therefore, a variety of shapes (or cross-sections) of electron beam can be obtained simply by changing the degree by and the direction in which the electron beam is deflected with respect to the aperture of the second mask (See FIG. 3). In forming a desired pattern on a target substrate, a variety of electron beams are produced by deflecting the electron beam with respect to the aperture of the second mask, and the target is selectively and repeatedly exposed to each of such different electron beams so as to constitute the desired pattern in the form of patchwork.

FIGS. 3 and 4 show different shapes of the first and second apertured masks and a variety of cross-sections of electron beam which can be produced by defining a passable area in the path of electron beam.

FIG. 3 shows the manner in which the square electron beam is changed both in cross-section and position. Specifically, FIG. 3(a) shows that the square electron beam is reduced without changing the shape of cross-section of the beam. FIGS. 3(b) and (c) show that the square electron beam is changed to a rectangular one. FIG. 3(d) shows that the square electron beam is reduced to a possible minimum. FIG. 4 shows the manner in which the pentagon electron beam (broken line) is changed both in cross-section and position. Specifically FIG. 4(a) shows that the pentagon electron beam is reduced and changed to a square electron beam. FIGS. 4(b) and (c) show that the pentagon electron beam (broken line) is reduced and changed to a rectangular one. As for such rectangular beam as shown in FIGS. 3 and 4, two square apertures put a rectangular patch at such an orthogonal position on the target as shown in FIGS. 3(b) and (c), whereas two pentagon apertures put a similar rectangular patch at a 45° position on the target as shown in FIGS. 4(b) and (c).

In producing microcircuits a variety of electron beams each having a different cross-section are produced by deflecting the electron beam in the intermediate course between the two apertured masks, and a selected area of the target substrate is exposed to each of such different electron beams, thus forming a desired pattern on the target in the form of patchwork.

Some particulars of an actual example are:

| | |
|---|---|
| aperture size of a first set of square-apertured masks: | 125 × 125 microns |
| aperture size of a second set of square apertured masks: | 250 × 250 microns |
| distance between the two apertured masks: | 180 millimeters |
| focal distance of the first converging lens 12: | 45 millimeters |
| focal distance of the second converging lens 13: | 45 millimeters |
| beam accelerating voltage: | 20 kilovolts |
| beam current: | 1 microampere |
| brightness: | $5 \times 10^5$ A/cm$^2$ Ω |
| beam sweeping range: | 2 × 2 millimeters |
| shift range of the stage: | 130 × 130 millimeters |

In operation the cross-section of the electron beam was changed in the range from 0.5 × 0.5 to 25 × 25 microns.

The beam positioning accuracy is ± 0.3 microns. A relatively complicated pattern was formed on a wafer target (50 × 50 millimeters) in 60 minutes (exposure time).

The same pattern was formed by beam spot blotting in several 10 hours.

This invention is described above as applicable to forming a circuit pattern on a wafer target. However, it should be noted that this invention is equally applicable to production of optical masks having a precision aperture pattern.

From the foregoing description, the artisan will appreciate that the invention provides a method of projecting a beam of charged particles, from a source 8 to a target 19 through two apertured masks 11 and 15. This method comprises essentially deflecting the beam, after passing through the aperture 10 of the first mask 11 and before passing through the aperture 14 of the second mask 15, in a transverse direction and by a distance, which direction and distance of deflection are selected in accordance with the aperture contours of each of the masks 11 and 15 to establish by the combined interception action of said masks, a predetermined beam cross-section at the incidence of the beam on the target 19.

The invention provides an apparatus for carrying out this method and basically such apparatus has an improvement over the prior art comprising the beam deflection means 16 which is operable to deflect the beam to pass through a predetermined region of a transverse two-dimensional plane so that the cross-section of the beam at the incidence thereof on the target 19 will be determined by the contours of the apertures 10, 14, of the masks 11, 15, and the location of such predetermined region through which the beam passes.

As indicated by FIG. 3A, FIG. 3B, FIG. 3C, FIG. 3D, FIG. 4A, FIG. 4B, FIG. 4C., the masks 11 and 15 have apertures 10, 14 each of a polygonal contour. This polygonal contour can be, by way of example, square or can be pentagonal, or some other polygonal shape not shown. From FIGS. 3A – 3D and FIGS. 4A – 4C, it can be noted that the beam in the examples shown is deflected in a direction generally parallel to some one side of a polygonal aperture of one of the masks 11, 15.

What is claimed is:

1. A method of projecting a beam of charged particles to a target through two apertured masks which comprises focusing a beam of charged particles on the first of said masks, passing said beam through the aperture of said first mask to establish a beam cross-section corresponding to the contour of said first mask aperture, deflecting said beam, after passing through the first of said masks and before passing through the second of said masks, in a transverse direction and by a given distance with respect to said second aperture, focusing the deflected beam on the second of said masks, passing only a portion of said beam through the aperture of said second mask to modify the cross-section of said beam in accordance with the contour of said second mask aperture and the direction and distance of said deflection to thereby establish by the combined interception action of said masks a predetermined beam cross-section at the incidence of the beam on the target.

2. A method according to claim 1 wherein said masks have apertures each of polygonal contour, and the beam is deflected in a direction generally parallel to one side of the polygonal aperture of one of said masks.

3. A method according to claim 1 wherein said beam of charged particles is a beam of electrons.

4. A method according to claim 1 wherein said beam of charged particles is a beam of ions.

5. In an apparatus for projecting a beam of charged particles to a target through two apertured masks, the improvement which comprises first lens means operable to focus a beam of charged particles upon the first of said masks and to pass said beam through the aperture of said first mask to establish a beam cross-section corresponding to the contour of said first mask aperture, deflector means positioned to deflect said beam, after passing through the first of said masks and before passing through the second of said masks, said deflector means deflecting said beam with respect to said second aperture in a transverse direction and by a given distance to pass through a predetermined region of a transverse two-dimensional plane, second lens means operable to focus the deflected beam upon the second of said masks and to pass only a portion of said beam through the aperture of said second mask to modify the cross-section of said beam in accordance with the contour of said second mask aperture and the distance and direction of said deflection to thereby establish by the combined interception action of said masks a predetermined beam cross-section at the incidence of the beam on the target.

6. The improvement according to claim 5 wherein said masks have apertures each of a polygonal contour.

7. The improvement according to claim 6 wherein said masks have apertures each of a square contour.

8. The improvement according to claim 6 wherein said masks have apertures each of a pentagonal contour.

9. The improvement according to claim 6 wherein said target is a substrate in which electric circuits are built.

* * * * *